(12) United States Patent
Kim et al.

(10) Patent No.: US 10,490,541 B2
(45) Date of Patent: *Nov. 26, 2019

(54) LED DISPLAY MODULES AND METHODS FOR MAKING THE SAME

(71) Applicant: LUMENS CO., LTD., Yongin-si, Gyeonggi-do (KR)

(72) Inventors: Daewon Kim, Yongin-si (KR); Jinmo Kim, Yongin-si (KR); Jinwon Choi, Yongin-si (KR); Younghwan Shin, Yongin-si (KR); Jimin Her, Yongin-si (KR); Sol Han, Yongin-si (KR); Kyujin Lee, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/124,099

(22) Filed: Sep. 6, 2018

(65) Prior Publication Data

US 2019/0019786 A1 Jan. 17, 2019

Related U.S. Application Data

(63) Continuation of application No. 15/713,633, filed on Sep. 23, 2017, now Pat. No. 10,096,586.

(30) Foreign Application Priority Data

Oct. 11, 2016 (KR) .......................... 10-2016-0131038
Jan. 3, 2017 (KR) .......................... 10-2017-0000553

(51) Int. Cl.
H01L 25/00 (2006.01)
H01L 25/16 (2006.01)
(Continued)

(52) U.S. Cl.
CPC .............. *H01L 25/50* (2013.01); *H01L 24/11* (2013.01); *H01L 24/81* (2013.01);
(Continued)

(58) Field of Classification Search
None
See application file for complete search history.

(56) References Cited

U.S. PATENT DOCUMENTS 10,096,586 B2 * 10/2018 Kim ..................... H01L 25/50
2012/0320581 A1 * 12/2012 Rogers .................. H01L 24/24
362/235

(Continued)

*Primary Examiner* — Alexander G Ghyka
(74) *Attorney, Agent, or Firm* — Mei & Mark LLP

(57) ABSTRACT

An LED display module is disclosed. The LED display module includes: an active matrix substrate including a plurality of control units; a plurality of pairs of solder bumps arranged in a matrix on the active matrix substrate by transfer printing; a plurality of LED chips including pairs of electrodes connected to the corresponding plurality of pairs of solder bumps and arranged in a matrix on the active matrix substrate by transfer printing; grid barriers formed on the active matrix substrate to isolate the plurality of LED chips into individual chip units; and a multi-color cell layer including a plurality of color cells and aligned with the active matrix substrate such that the plurality of color cells match the plurality of LED chips in a one-to-one relationship. The plurality of color cells include first color cells, second color cells, and third color cells disposed consecutively in one direction.

16 Claims, 13 Drawing Sheets

(51) Int. Cl.
*H01L 23/00* (2006.01)
*H01L 25/075* (2006.01)
*H01L 33/50* (2010.01)

(52) U.S. Cl.
CPC ........ *H01L 25/0753* (2013.01); *H01L 25/167* (2013.01); *H01L 33/50* (2013.01); *H01L 2224/11003* (2013.01)

(56) References Cited

U.S. PATENT DOCUMENTS

| | | | |
|---|---|---|---|
| 2016/0284780 A1* | 9/2016 | Motoyama | H01L 51/5265 |
| 2018/0175268 A1* | 6/2018 | Moon | H01L 33/62 |
| 2018/0196629 A1* | 7/2018 | Ikeda | G06F 3/0412 |
| 2018/0245773 A1* | 8/2018 | Nishida | F21V 9/08 |
| 2018/0269267 A1* | 9/2018 | Ohchi | G09F 9/30 |
| 2018/0366514 A1* | 12/2018 | Kimura | H01L 27/3213 |

* cited by examiner

First color cell
Second color cell
Third color cell

LED DISPLAY MODULES AND METHODS FOR MAKING THE SAME

This is a continuation of U.S. patent application Ser. No. 15/713,633, filed Sep. 23, 2017, which is incorporated herein by reference.

TECHNICAL FIELD

The present invention relates to LED display modules including LED chips arranged in a matrix on an active matrix substrate, and more specifically to LED display modules including LED chips arranged in a matrix on an active matrix substrate by transfer printing.

BACKGROUND

Full-color light emitting diode (LED) displays in which LEDs emitting light at different wavelengths are grouped into pixels have been proposed as potential replacements for displays using LEDs as backlight light sources. Each pixel consists of red, green, and blue LEDs or red, green, blue, and white LEDs. In such an LED display, red, green, and blue LEDs are fabricated in packages and are mounted on a substrate. However, due to the large distances between the constituent LEDs of each pixel, high-quality resolution is difficult to obtain. Pixels consisting of packages of LEDs are difficult to apply to micro-LED displays that have recently received much attention. LED pixel units have also been proposed in which red LEDs, green LEDs, and blue LEDs constituting one pixel are mounted in one package. In such an LED pixel unit, the distance between the adjacent LEDs (i.e. sub-pixels) in one pixel is small but the distance between the adjacent pixels is difficult to reduce. Further, light interference may occur between the red, green, and blue LEDs.

Thus, for the purpose of reducing the distance between pixels, an attempt has been made to fabricate an LED display module in which groups of LED chips, each of which includes red LED, green LED, and blue LED chips, are arrayed in a matrix on a substrate. It is, however, difficult to mount the LED chips at predetermined heights and intervals on the micrometer-sized substrate. Different heights and intervals between the LED chips mounted on the substrate deteriorate the color reproducibility of the LED display module. Wire bonding is necessary for electrical connection between electrode pads and the LED chips on the substrate but it takes at least tens to hundreds of hours to manufacture one product.

Particularly, in the course of mounting tens to hundreds of LED chips on the substrate, there is a high possibility that some of the LED chips may not be accurately located at desired heights from the substrate at desired positions on the substrate. In this case, a designed light emitting pattern cannot be achieved, resulting in poor color reproducibility. Further, the LED chips are required to emit light at various wavelengths and should be divided on the basis of wavelength. For example, the LED chips emitting light at different wavelengths should be divided into unit groups. Thereafter, the unit groups should be arranged, making it troublesome and difficult to fabricate the LED display modules.

SUMMARY

The present invention has been made in an effort to solve at least the problems noted above. In an aspect of the present disclosure, LED display modules including LED chips arranged in a matrix on an active matrix substrate by transfer printing are disclosed.

In another aspect of the present disclosure, techniques for minimizing a distance between pixels and/or a distance between LEDs in each pixel are provided herein.

A method for fabricating an LED display module according to one aspect of the present disclosure includes: preparing an active matrix substrate including a plurality of control units; transferring a plurality of pairs of solder bumps arranged in a matrix on a bump support to the active matrix substrate by primary transfer printing while maintaining the original matrix of the solder bumps; transferring a plurality of LED chips arranged in a matrix on a chip support to the active matrix substrate by secondary transfer printing while maintaining the original matrix of the LED chips; forming grid barriers on the active matrix substrate on which the plurality of LED chips are arranged in a matrix, to isolate the plurality of LED chips into individual chip units; and matching a plurality of color cells including first color cells, second color cells, and third color cells disposed consecutively in one direction to the plurality of LED chips.

According to one embodiment, the active matrix substrate may be prepared by a CMOS process to form a control circuit in which a plurality of control units are arranged in a matrix on a base substrate.

According to one embodiment, the primary transfer printing may include feeding a bonding carrier through a gap between the bump support and a pick-up roller and a gap between the active matrix substrate and a placing roller.

According to one embodiment, the primary transfer printing may include allowing a pick-up roller to pressurize one area of the bonding carrier against the bump support when the one area of the bonding carrier is interposed between the bump support and the pick-up roller, to bond the plurality of solder bumps to the bonding carrier while maintaining the original matrix of the solder bumps on the bump support.

According to one embodiment, the primary transfer printing may include allowing a placing roller to pressurize the one area of the bonding carrier to which the plurality of solder bumps are bonded against the active matrix substrate when the one area of the bonding carrier is interposed between the active matrix substrate and the placing roller, to transfer and attach the plurality of solder bumps to the active matrix substrate while maintaining the original matrix of the solder bumps.

According to one embodiment, the primary transfer printing may include allowing a pick-up roller to pressurize one area of the bonding carrier against the bump support when the one area of the bonding carrier is interposed between the bump support and the pick-up roller, to bond the plurality of pairs of solder bumps to the bonding carrier while maintaining the original matrix of the pairs of solder bumps on the bump support.

According to one embodiment, the primary transfer printing may include allowing a placing roller to pressurize the one area of the bonding carrier to which the plurality of pairs of solder bumps are bonded against the active matrix substrate when the one area of the bonding carrier is interposed between the active matrix substrate and the placing roller, to transfer and attach the plurality of pairs of solder bumps to the active matrix substrate while maintaining the original matrix of the pairs of solder bumps.

According to one embodiment, the secondary transfer printing may include feeding a bonding carrier through a gap between the chip support and a pick-up roller and a gap between the active matrix substrate and a placing roller.

According to one embodiment, the secondary transfer printing may include allowing a pick-up roller to pressurize one area of the bonding carrier against the chip support when the one area of the bonding carrier is interposed between the chip support and the pick-up roller, to bond the plurality of LED chips to the chip support while maintaining the original matrix of the plurality of LED chips on the chip support.

According to one embodiment, the secondary transfer printing may include allowing a placing roller to pressurize the one area of the bonding carrier to which the plurality of LED chips are bonded against the active matrix substrate when the one area of the bonding carrier is interposed between the active matrix substrate and the placing roller and pairs of electrodes of the LED chips face the corresponding pairs of solder bumps, to transfer and attach the plurality of LED chips to the active matrix substrate while maintaining the original matrix of the plurality of LED chips.

According to one embodiment, the grid barriers may be formed by screen printing with a black color material to isolate the chips.

According to one embodiment, the color cell matching may include: forming a single multi-color cell layer in which the plurality of color cells are arranged in a matrix; and matching the LED chips arranged in a matrix on the active matrix substrate to the color cells in a one-to-one relationship.

According to one embodiment, the color cell matching may include: forming a multi-color cell layer in which the plurality of color cells are arranged in a matrix and spaces between the neighboring color cells are filled with light blocking grids; and aligning the active matrix substrate with the multi-color cell layer.

According to one embodiment, the plurality of LED chips may be blue LED chips, the first color cells may include quantum dots or a fluorescent material through which blue light from the corresponding blue LED chips is converted to red light, the second color cells may include quantum dots or a fluorescent material through which blue light from the corresponding blue LED chips is converted to green light, and the third color cells may allow blue light from the corresponding blue LED chips to pass therethrough without color change.

According to one embodiment, the third color cells may include a green fluorescent material.

According to one embodiment, the plurality of LED chips may include UV LED chips, the first color cells may include quantum dots or a fluorescent material through which UV light from the corresponding UV LED chips is converted to red light, the second color cells may include quantum dots or a fluorescent material through which UV light from the corresponding UV LED chips is converted to green light, and the third color cells may include quantum dots or a fluorescent material through which UV light from the corresponding UV LED chips is converted to blue light.

A display module according to a further aspect of the present disclosure may include: an active matrix substrate including a plurality of control units; a plurality of pairs of solder bumps arranged in a matrix on the active matrix substrate by transfer printing; a plurality of LED chips including pairs of electrodes connected to the corresponding plurality of pairs of solder bumps and arranged in a matrix at a constant height on the active matrix substrate by transfer printing; grid barriers formed on the active matrix substrate to isolate the plurality of LED chips into individual chip units; and a multi-color cell layer including a plurality of color cells and aligned with the active matrix substrate such that the plurality of color cells match the plurality of LED chips in a one-to-one relationship, wherein the plurality of color cells include first color cells, second color cells, and third color cells disposed consecutively in one direction.

According to one embodiment, the plurality of LED chips may include blue LED chips, the first color cells may include quantum dots or a fluorescent material through which blue light from the corresponding blue LED chips is converted to red light, the second color cells may include quantum dots or a fluorescent material through which blue light from the corresponding blue LED chips is converted to green light, and the third color cells may allow blue light from the blue LED chips to pass therethrough without color change.

According to one embodiment, the third color cells may include a green fluorescent material.

According to one embodiment, the plurality of LED chips may include ultra violet (UV) LED chips, the first color cells include quantum dots or a fluorescent material through which UV light from the corresponding UV LED chips is converted to red light, the second color cells may include quantum dots or a fluorescent material through which UV light from the corresponding UV LED chips is converted to green light, and the third color cells may include quantum dots or a fluorescent material through which UV light from the corresponding UV LED chips is converted to blue light.

According to one embodiment, the multi-color cell layer may further include light blocking grids disposed to fill spaces between the neighboring color cells, and the overlying light blocking grids and the underlying grid barriers are arranged to face each other.

A display module according to another aspect of the present disclosure may include: an active matrix substrate including a plurality of control units; a plurality of pairs of solder bumps arranged in a matrix on the active matrix substrate; a plurality of LED chips including pairs of electrodes connected to the corresponding plurality of pairs of solder bumps and arranged in a matrix at a constant height on the active matrix substrate; grid barriers formed on the active matrix substrate to isolate the plurality of LED chips into individual chip units; and a multi-color cell layer including a plurality of color cells and aligned with the active matrix substrate such that the plurality of color cells match the plurality of LED chips in a one-to-one relationship, wherein the plurality of color cells include first color cells, second color cells, and third color cells disposed consecutively in one direction.

According to a first embodiment of the present disclosure, the LED display modules may include LED chips arranged in a matrix on an active matrix substrate. According to the present invention, the LED chips are arranged in a matrix on the active matrix substrate by transfer printing.

According to an aspect of the present disclosure, the micrometer-sized LED chips may be mounted in a matrix at a uniform height on the active matrix substrate. The arrangement and dimensions lead to a marked improvement in the color reproducibility of the final LED display modules.

According to an aspect of the present disclosure, a plurality of solder bumps can be arranged on the active matrix substrate in an easy and precise manner within a short time without requiring much labor.

According to an aspect of the present disclosure, the plurality of LED chips are precisely mounted in a matrix on the active matrix substrate on which the solder bumps are precisely arrayed in a matrix. With this arrangement, the solder bumps can be individually electrically connected to the LED chips in a controllable manner. Particularly, in the course of mounting tens to hundreds of LED chips on the substrate, there is a high possibility that some of the LED chips may not be accurately located at desired heights from the substrate at desired positions on the substrate. In this case, a designed light emitting pattern cannot be achieved, resulting in poor color reproducibility. Further, the LED chips are required to emit light at various wavelengths and should be divided on the basis of wavelength. For example, the LED chips emitting light at different wavelengths should be divided into unit groups. Thereafter, the unit groups should be arranged, making it troublesome and difficult to fabricate the LED display modules. In contrast, according to an aspect of the present disclosure, grid barriers and light blocking grids disposed in a multi-color cell layer can provide perfect light isolation between pixels and between sub-pixels.

According to a second embodiment of the present disclosure, the LED pixel unit may be provided to minimize the distance between pixels and the distance between sub-pixels in each pixel when applied to an LED display. The applicability of the LED pixel unit can be extended to a micro-LED display. There is a limitation in reducing the size of pixels to about 200 $\mu m^2$ in conventional LED displays. In contrast, according to the second embodiment of the present disclosure, the pixel size of the LED pixel unit can be significantly reduced to about 100 $\mu m^2$ or less, making the LED pixel unit applicable to a UHD display. In addition, according to the second embodiment of the present disclosure, the LED pixel unit may be constructed in a simple manner. Furthermore, light interference between constituent light emitting units of sub-pixels of the LED pixel unit can be substantially completely blocked.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Exemplary embodiments of the present invention will now be described with reference to the accompanying drawings.

[First Embodiment]

1. Fabrication of LED Display Module

Figure 1:
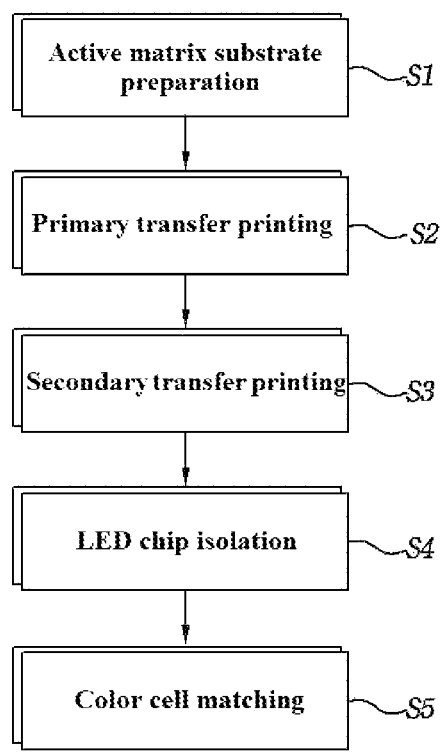
FIG. 1 is a flow chart for schematically explaining a method for fabricating an LED display module according to a first embodiment of the present invention.

FIG. 1 illustrates a method for fabricating an LED display module according to a first embodiment of the present invention. Referring to FIG. 1, the method essentially includes: (S1) preparation of an active matrix substrate; (S2) primary transfer printing for forming pairs of solder bumps arranged in a matrix on the active matrix substrate; (S3) secondary transfer printing for mounting LED chips emitting light of the same wavelength in a matrix on the active matrix substrate; (S4) isolation of the LED chips mounted on the active matrix substrate into individual chip units; and (S5) matching of color cells including first color cells, second color cells, and third color cells to the LED chips.

Preparation of Active Matrix Substrate (S1)

Figure 2:
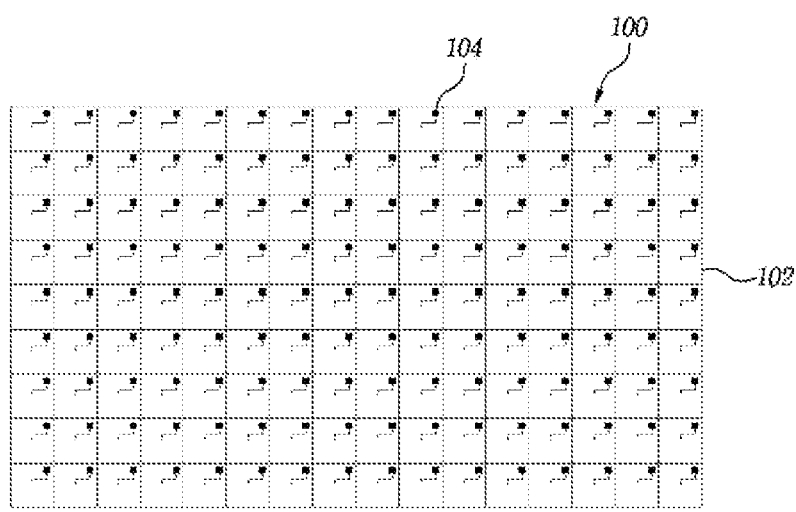
FIG. 2 is a plan view illustrating an active matrix substrate prepared in the method of FIG. 1.
Figure 3:
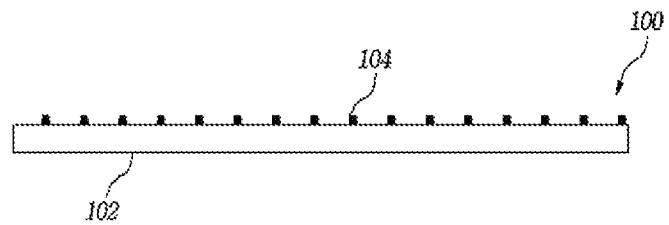
FIG. 3 is a front view illustrating an active matrix substrate prepared in the method of FIG. 1.

Referring to FIGS. 2 and 3, an active matrix substrate 100 formed with a control circuit is prepared on a base substrate 102, for example, by a CMOS process. The CMOS process can be carried out similarly to a general TFT backplane process. The control circuit may include electrode patterns to which micro-LED chips having a size of 100 μm or less are applicable. The control circuit includes a plurality of control units 104 arranged in a matrix to individually control a plurality of LED chips connected to the electrode patterns. For example, a constant current source may be applied to the control circuit to individually control a plurality of LED chips. A constant rectification source may be applied to the control circuit to individually control a plurality of LED chips. For example, the control circuit may function as a static or time-resolved multiplex cathode driver, an on/off control driver or a pulse width modulation (PWM) control driver.

Primary Transfer Printing (S2)

Figure 4:
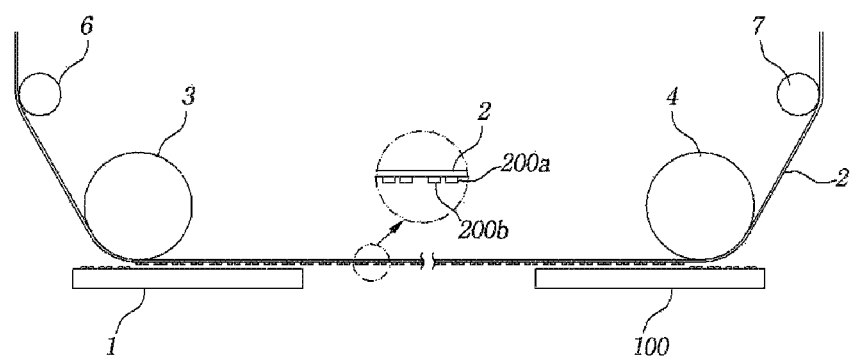
FIG. 4 is a view for explaining primary transfer printing for arranging pairs of solder bumps in a matrix on an active matrix substrate.
Figure 5:
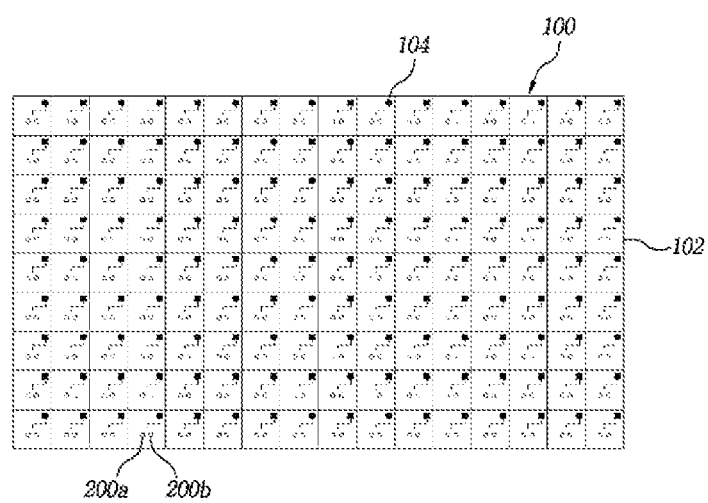
FIG. 5 is a plan view illustrating pairs of solder bumps arranged in a matrix on a substrate by primary transfer printing.

Referring to FIGS. 4 and 5, a plurality of solder bumps 200a and 200b are transferred to the upper surface of the active matrix substrate 100 by primary transfer printing. The primary transfer printing allows the arrangement of the plurality of pairs of solder bumps 200a and 200b in a matrix on the upper surface of the active matrix substrate 100. Electrode patterns corresponding to electrodes of micro-LED chips having a size of 100 μm or less are previously formed at a predetermined height on the upper surface of the active matrix substrate 100. The electrode patterns are omitted to avoid complexity. Each of the electrode patterns includes a pair of electrode patterns corresponding to a pair of bumps. The "solder bumps" are sometimes called "bump balls" or "solder balls" before flip-chip bonding of LED chips. For convenience, the term "solder bumps" will be used throughout the entire specification.

The primary transfer printing (S2) includes transferring pairs of solder bumps 200a and 200b arranged in a matrix on a bump support 1 to the active matrix substrate 100 by a roll-to-roll transfer printing technique while maintaining the original matrix of the solder bumps. A bonding carrier 2, a pick-up roller 3, and a placing roller 4 are used for primary transfer printing.

Just before the primary transfer printing (S2), a plurality of solder bumps 200a and 200b are arranged in a matrix on the bump support 1 and the bump support 1 is spaced a distance from the active matrix substrate 100. The pick-up roller 3 forms a gap with the bump support 1 and is arranged directly above the bump support 1. The placing roller 4 forms a gap with the active matrix substrate 100 and is arranged directly above the active matrix substrate 100.

The bonding carrier 2 takes the form of a film. The bonding carrier 2 is moved in one direction by transfer rollers 6 and 7 and sequentially passes through the gap between the bump support 1 and the pick-up roller 3 and the gap between the active matrix substrate 100 and the placing roller 4.

When one area of the bonding carrier 2 is interposed between the bump support 1 and the pick-up roller 3, the pick-up roller 3 rolls while pressurizing the one area of the bonding carrier 2 against the bump support 1. As a result, the solder bumps 200a and 200b are bonded to the bonding carrier 2 while maintaining the original matrix of the solder bumps 200a and 200b on the bump support 1. When the bonding carrier 2 is further moved until the area of the bonding carrier 2 to which the solder bumps 200a and 200b are bonded reaches the gap between the active matrix substrate 100 and the placing roller 4, the placing roller 4 rolls while pressurizing the corresponding area of the bonding carrier 2 against the active matrix substrate 100. As a result, the solder bumps 200a and 200b are transferred and attached to the active matrix substrate 100 while maintaining the original matrix of the solder bumps 200a and 200b bonded to the bonding carrier 2. Here, the active matrix substrate 100 is imparted with a higher adhesive strength than the bonding carrier 2. Before attachment of the solder bumps 200a and 200b to the bonding carrier 2, the bonding carrier 2 may be primarily exposed to light. The primary exposure reduces the adhesive strength of the bonding carrier 2 section-wise. Before attachment of the solder bumps 200a and 200b to the active matrix substrate 100, the bonding carrier 2 may be secondarily exposed to light. The secondary exposure reduces the adhesive strength of the bonding carrier 2 as a whole. By the primary transfer printing (S2), the plurality of pairs of solder bumps 200a and 200b are arranged in a matrix on the active matrix substrate 100.

Secondary Transfer Printing (S3)

Figure 6:
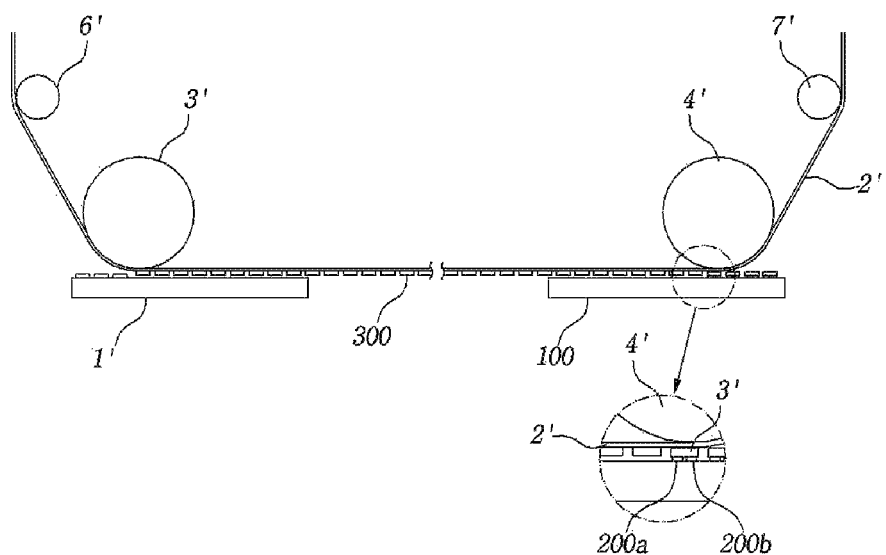
FIG. 6 is a view for explaining secondary transfer printing for arranging LED chips in a matrix on an active matrix substrate.
Figure 7:
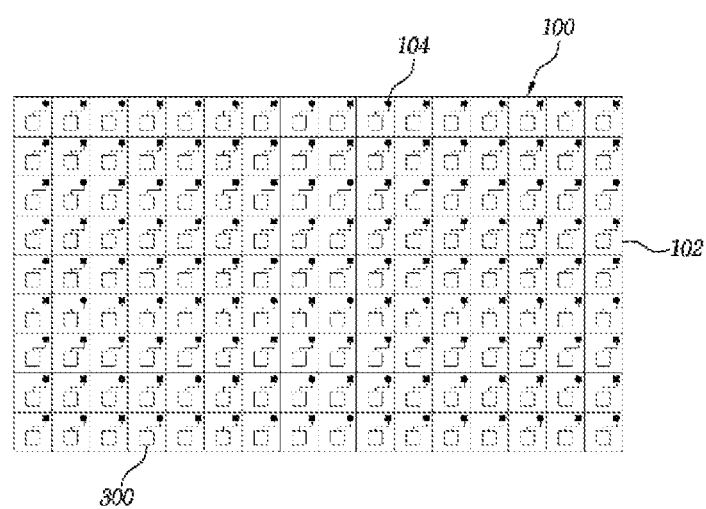
FIG. 7 is a plan view illustrating LED chips mounted in a matrix on an active matrix substrate after secondary transfer printing.
Figure 8:
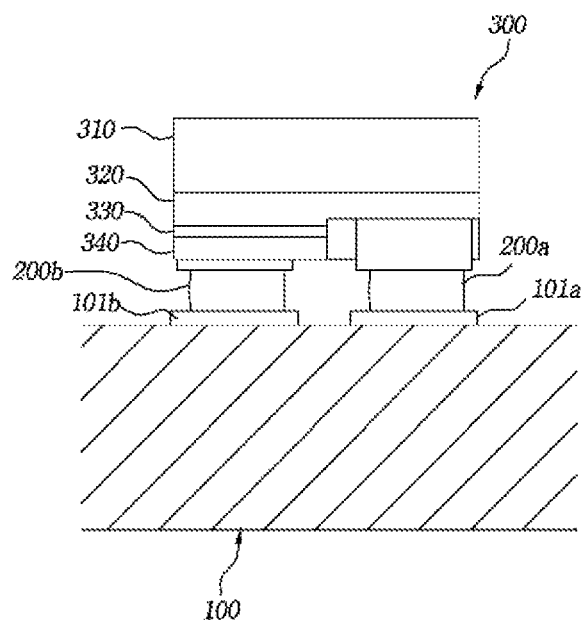
FIG. 8 is a cross-sectional view illustrating an LED chip flip-chip bonded to an active matrix substrate after secondary transfer printing.

Referring to FIGS. 6 to 8, a plurality of LED chips 300 are transferred to the upper surface of the active matrix substrate 100 by secondary transfer printing. As a result of the secondary transfer printing, the plurality of LED chips 300 are arranged in a matrix on the upper surface of the active matrix substrate 100. The plurality of LED chips 300 are connected to the pairs of solder bumps 200a and 200b and are electrically connected to the electrode patterns 101a and 101b formed on the upper surface of the active matrix substrate 100. Simultaneously with the secondary transfer printing, the solder bumps can be bonded to the active matrix substrate 100 under heat and pressure. Alternatively, the solder bumps may be bonded to the active matrix substrate 100 under heat and pressure after the secondary transfer printing.

The secondary transfer printing (S3) includes transferring LED chips 300 arranged in a matrix on a chip support 1' to the active matrix substrate 100 by a roll-to-roll transfer printing technique while maintaining the original matrix of the LED chips 300. A bonding carrier 2', a pick-up roller 3', and a placing roller 4' are used for secondary transfer printing.

Just before the secondary transfer printing (S3), a plurality of LED chips 300 are arranged in a matrix on the chip support 1' and the chip support 1' is spaced a distance from the active matrix substrate 100. The pick-up roller 3' forms a gap with the chip support 1' and is arranged directly above the chip support 1'. The placing roller 4' forms a gap with the active matrix substrate 100 and is arranged directly above the active matrix substrate 100.

The bonding carrier 2' takes the form of a film. The bonding carrier 2' is moved in one direction by transfer rollers 6' and 7' and sequentially passes through the gap between the chip support 1' and the pick-up roller 3' and the gap between the active matrix substrate 100 and the placing roller 4'.

When one area of the bonding carrier 2' is interposed between the chip support 1' and the pick-up roller 3', the pick-up roller 3' rolls while pressurizing the one area of the bonding carrier 2' against the chip support 1'. As a result, the LED chips 300 are bonded to the bonding carrier 2' while maintaining the original matrix of the LED chips 300 on the chip support 1'. When the bonding carrier 2' is further moved until the area of the bonding carrier 2' to which the LED chips 300 are bonded reaches the gap between the active matrix substrate 100 and the placing roller 4' and pairs of electrodes 301a and 301b of the LED chips 300 face the corresponding pairs of solder bumps 200a and 200b, the placing roller 4' rolls while pressurizing the corresponding area of the bonding carrier 2' against the active matrix substrate 100. As a result, the LED chips 300 are transferred and attached to the active matrix substrate 100 while maintaining the original matrix of the LED chips 300 bonded to the bonding carrier 2'. Here, the active matrix substrate 100 is imparted with a higher adhesive strength than the bonding carrier 2'. Before attachment of the LED chips 300 to the bonding carrier 2', the bonding carrier 2' may be primarily exposed to light. The primary exposure reduces the adhesive strength of the bonding carrier 2' section-wise. Before attachment of the LED chips 300 to the active matrix substrate 100, the bonding carrier 2' may be secondarily exposed to light. The secondary exposure reduces the adhesive strength of the bonding carrier 2' as a whole. By the secondary transfer printing (S3), the plurality of LED chips 300 including the plurality of electrode layers 301a and 301b connected to the pairs of solder bumps 200a and 200b are arranged in a matrix on the active matrix substrate 100.

As well illustrated in FIG. 8, each of the LED chips 300 is made of gallium nitride semiconductors emitting short wavelength light (for example, blue light) and includes a transparent substrate 310 having two opposite surfaces, i.e. an upper surface through which light is emitted and a lower surface on which semiconductors grow, and a first conductive semiconductor layer 320, an active layer 330, and a second conductive semiconductor layer 340 formed sequentially downward from the lower surface of the transparent substrate 310. The transparent substrate 310 may be made of sapphire. The first conductive semiconductor layer 320, the active layer 330, and the second conductive semiconductor layer 340 may be gallium nitride semiconductor layers grown on the sapphire substrate 310. The first conductive semiconductor layer 320 may be an n-type semiconductor layer and the second conductive semiconductor layer 340 may be a p-type semiconductor layer. The active layer 330 may include multi-quantum wells. The first conductive semiconductor layer 320 and the second conductive semiconductor layer 340 are stepped on the lower surface of the LED chip 300. A first conductive electrode 301a is disposed in an area of the first conductive semiconductor layer 320 on the lower surface of the LED chip and a second conductive electrode 301b is disposed in an area of the second conductive semiconductor layer 340 on the lower surface of the LED chip.

The active matrix substrate 100 includes a plurality of electrode patterns arranged in a matrix. Each of the electrode patterns includes a first electrode pad 101a and a second electrode pad 101b. The pairs of solder bumps include a first solder bump 200a and a second solder bump 200b. The first solder bump 200a connects the first conductive electrode 301a of the LED chip 300 to the first electrode pad 101a of the active matrix substrate 100 and the second solder bump 200b connects the second conductive electrode 301b of the LED chip 300 to the first electrode pad 101a of the active matrix substrate 100. The plurality of pairs of solder bumps 200a and 200b are arranged in a matrix so as to correspond to the matrix of the electrode patterns. Likewise, the plurality of LED chips 300 are arranged in a matrix so as to correspond to the matrix of the plurality of pairs of solder bumps 200a and 200b. The plurality of LED chips 300 are preferably LED chips emitting short wavelength light, more preferably blue LED chips emitting blue light, when power is applied thereto.

Chip Isolation (S4)

Figure 9:
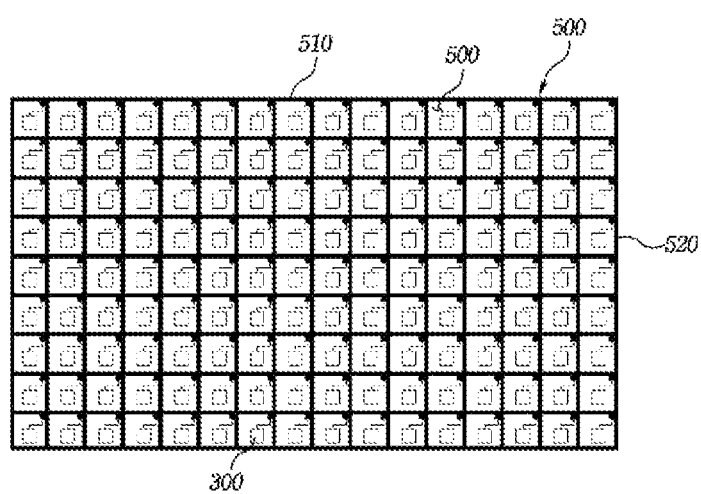
FIG. 9 is a plan view illustrating grid barriers formed on an active matrix substrate to isolate LED chips into individual chip units.

As illustrated in FIG. 9, grid barriers 500 are disposed on the active matrix substrate 100 on which the plurality of LED chips 300 are arranged in a matrix. The grid barriers isolate the plurality of LED chips 300 in individual chip units. The grid barriers 500 are made of a light absorbing black material and form unit cell spaces 501 surrounding the respective LED chips 300. The grid barriers 500 are provided to isolate the LED chips emitting light of different colors and may be formed by screen printing through a 3-dimensional shadow mask. The grid barriers 500 include a plurality of widthwise walls 510 and a plurality of lengthwise walls 520 orthogonal to the widthwise walls 510.

Color Cell Matching (S5)

Figure 10:
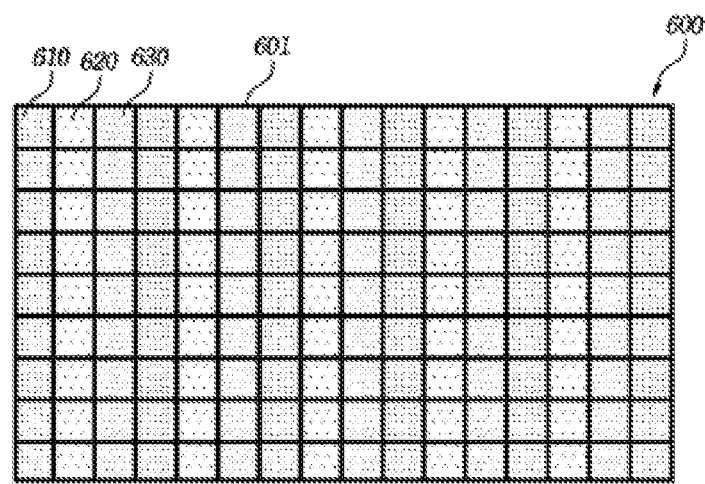
FIG. 10 is a plan view illustrating a multi-color cell layer including a plurality of color cells.
Figure 11:
FIG. 11 is a cross-sectional view illustrating a multi-color cell layer.
Figure 12:
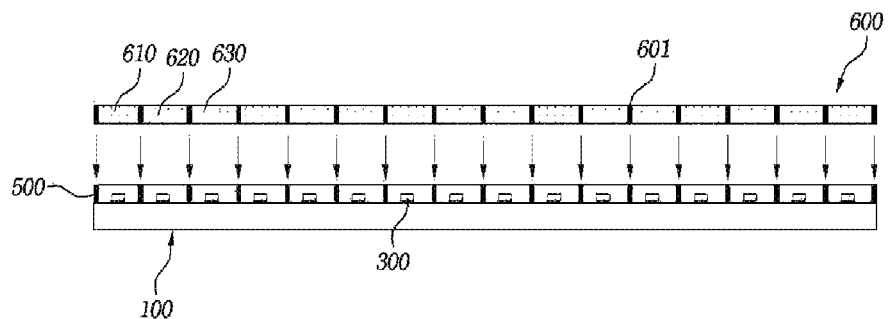
FIG. 12 is a view for explaining matching a plurality of color cells to LED chips.

Referring to FIGS. 10 to 12, a plurality of color cells 610, 620, and 630 match the corresponding LED chips 300. In this embodiment, the plurality of color cells 610, 620, and 630 may include first color cells 610 through which blue light from the corresponding LED chips 300 is converted to red light, second color cells 620 through which blue light from the corresponding LED chips 300 is converted to green light, and third color cells 630 allow blue light from the corresponding LED chips 300 to pass therethrough without color change.

A single multi-color cell layer 600 is formed in which the plurality of color cells 610, 620, and 630 are arranged in a matrix. The use of the single multi-color cell layer 600 facilitates matching of the plurality of color cells 610, 620, and 630 to the plurality of LED chips 300. The multi-color cell layer 600 is preferably formed by screen printing through a shadow mask.

The multi-color cell layer 600 includes light blocking grids 601 disposed to fill spaces between the neighboring color cells 610, 620, and 630, in addition to the color cells 610, 620, and 630 arranged in a matrix. The multi-color cell layer 600 has upper and lower surfaces parallel to each other. The upper and lower surfaces of the multi-color cell layer 600 lie at the same level as those of the light blocking grids 601. Color cell groups in which the color cells 610, 620, and 630 are sequentially arranged in a matrix in the widthwise or lengthwise direction are repeatedly arranged.

The color cell layer 600 including the light blocking grids 601 may be formed by screen printing with a light absorbing black color material.

In this embodiment, the first color cells 610 and the second color cells 620 receive short wavelength light from the corresponding LED chips 300, convert the wavelength of the received light, and outputs the wavelength-converted light. Each of the first color cells 610 and the second color cells 620 includes a wavelength converting material, such as quantum dots or a fluorescent material (or a phosphorescent material). Quantum dots are materials that output light of different wavelengths in response to changes in particle size. Quantum dots can be advantageously used in the embodiment of the present invention. In this embodiment, blue light emitted from the corresponding LED chips 300 is converted to red light through the first color cells 610 and blue light emitted from the corresponding LED chips 300 is converted to red light through the second color cells 620 located adjacent to the first color cells 610 in the widthwise direction. Meanwhile, blue light emitted from the corresponding LED chips 300 passes through the third color cells 630 located adjacent to the second color cells 620 in the widthwise direction without color change. To this end, the third color cells 630 are formed using a transparent material without a wavelength converting material. The three consecutive LED chips 300 in the widthwise direction can match the first color cell 610, the second color cell 620, and the third color cell 630, respectively, to form one pixel.

There may be used a combination of the color cells including a red wavelength converting material (quantum dots or a fluorescent material), the color cells including a green wavelength converting material, and the color cells including no transparent converting material matched to the neighboring blue LED chips, as described above. Alternatively, a combination of the color cells including a red wavelength converting material (quantum dots or a fluorescent material), the color cells including a green wavelength converting material, and the color cells including a blue wavelength converting material matched to neighboring UV LED chips may be used.

As best illustrated in FIG. 12, the active matrix substrate 100 on which the LED chips 300 are mounted is aligned with the multi-color cell layer 600 such that the LED chips 300 arranged in a matrix match the color cells 610, 620, and 630 in an one-to-one relationship. The peripheral portions of the active matrix substrate 100 and the multi-color cell layer 600 are sealed. When the multi-color cell layer 600 is aligned such that the LED chips 300 arranged in a matrix match the color cells 610, 620, and 630, the underlying grid barriers 500 disposed on the active matrix substrate 100 and the overlying grids 601 disposed in the multi-color cell layer 600 are aligned to face each other.

2. Structure of the LED Display Module

Figure 13:
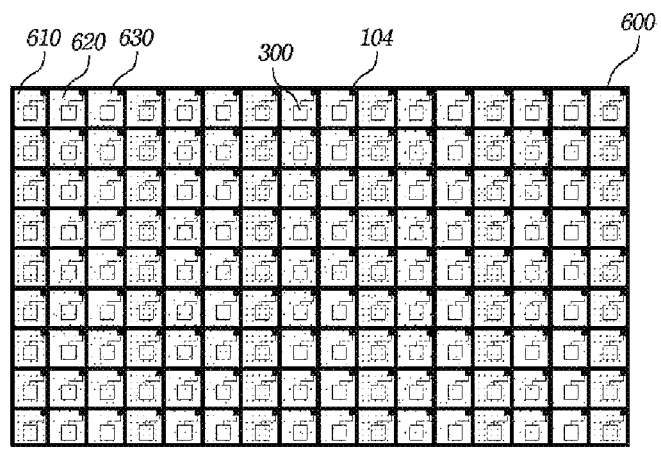
FIG. 13 is a plan view illustrating an LED display module fabricated by the method illustrated in FIGS. 1 to 12.
Figure 14:
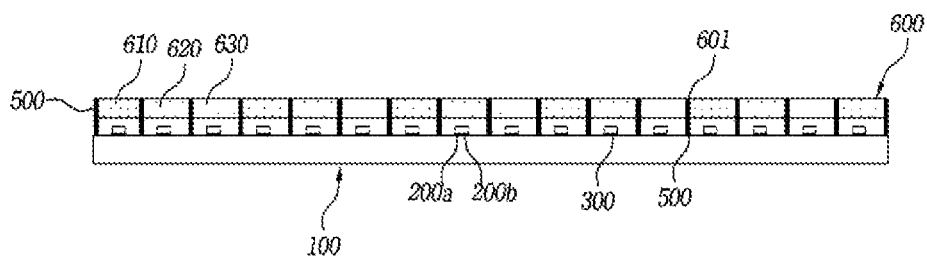
FIG. 14 is a cross-sectional view illustrating an LED display module fabricated by the method illustrated in FIGS. 1 to 12.

As illustrated in FIGS. 13 and 14, the LED display module according to the first embodiment of the present invention includes: an active matrix substrate 100 having a plurality of control units 104 arranged in a matrix; a plurality of pairs of solder bumps 200a and 200b arranged in a matrix on the active matrix substrate 100 by transfer printing so as to correspond to the plurality of control units 104; a plurality of LED chips 300 arranged in a matrix on the active matrix substrate 100 by transfer printing so as to be electrically connected to the plurality of pairs of solder bumps 200a and 200b, individually controlled by the plurality of control units 104, and emitting light of primary colors at a blue or UV wavelength when power is applied thereto; and a plurality of color cells 610, 620, and 630 matched to the plurality of LED chips 300.

The plurality of color cells 610, 620, and 630 are arranged consecutively along the widthwise or lengthwise direction and include first color cells 610, second color cells 620, and third color cell 630s adapted to receive the light of primary colors and to emit first color light, second color light, and third color light, respectively. The plurality of LED chips 300 may be blue LED chips. In this case, the first color cells 610 may include quantum dots or a fluorescent material to convert blue light to red light and emit the red light, the second color cells 620 may include quantum dots or a fluorescent material to convert blue light to green light and emit the green light, and the third color cells 630 may be formed using a transparent material to emit blue light without wavelength change. The third color cells 630 may include a green fluorescent material.

The plurality of color cells 610, 620, and 630 may be formed into one layer, that is, a multi-color cell layer 600. The color cells 610, 620, and 630 are arranged above the active matrix substrate 100 on which the plurality of LED chips 300 are mounted. The multi-color cell layer 600 includes light blocking grids 601 to isolate the first color cells 610 from the second color cells 620 and to isolate the second color cells 620 from the third color cells 630. The light blocking grids 601 are arranged to face the grid barriers adapted to isolate the LED chips 300 on the active matrix substrate 100. With this arrangement, the neighboring LED chip-color cell sets can be perfectly isolated from one another.

It is noted that unexplained structures of the LED display module are the same as the structures of the parts explained in the method for fabricating the LED display module.

[Second Embodiment]

Figure 15:
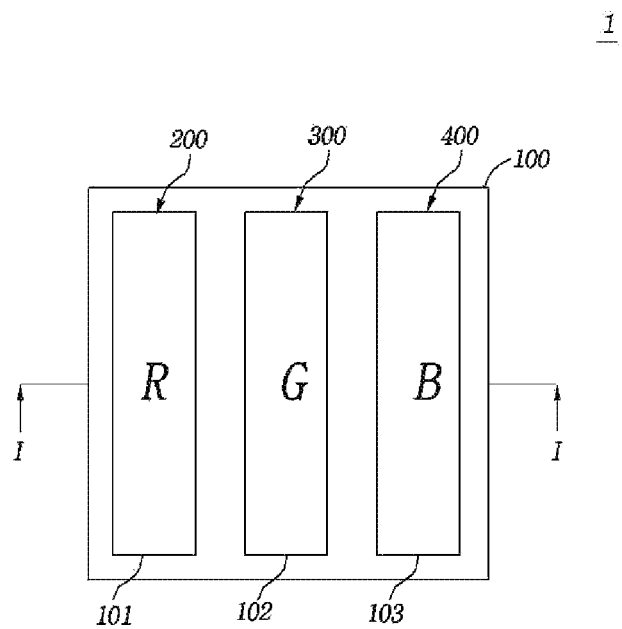
FIG. 15 is a plan view illustrating an LED pixel unit according to one embodiment of the present disclosure.
Figure 16:
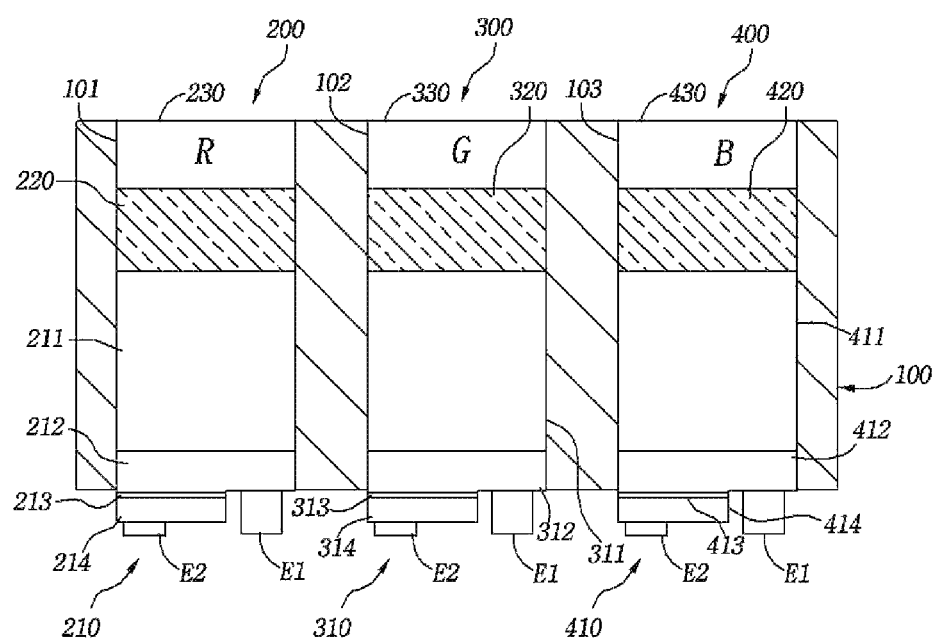
FIG. 16 is a cross-sectional view taken along line I-I of FIG. 15.
Figure 17:
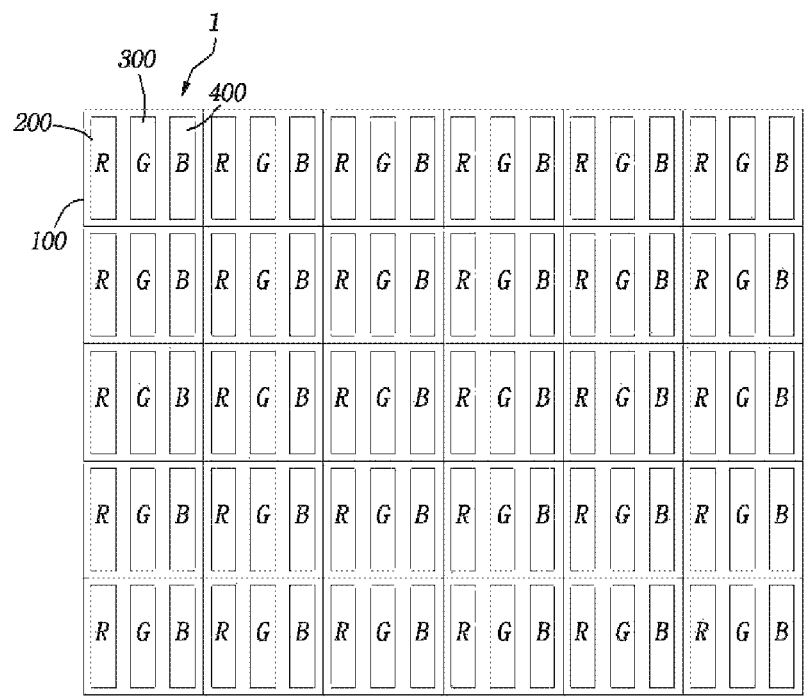
FIG. 17 is a plan view illustrating a micro-LED display panel to which the LED pixel unit of FIG. 15 is applied.

FIG. 15 is a plan view illustrating an LED pixel unit according to a second embodiment of the present invention, FIG. 16 is a cross-sectional view taken along line I-I of FIG. 15, and FIG. 17 is a plan view illustrating a micro-LED display panel to which the LED pixel unit of FIG. 15 is applied.

Referring to FIGS. 15 to 17, an LED pixel unit 1 according to a second embodiment of the present invention includes a light shielding wall 100 and first, second, and third light emitting units 200, 300, and 400.

The light shielding wall 100 includes upper and lower surfaces parallel to each other. A first vertical hole 101, a second vertical hole 102, and a third vertical hole 103 are formed in parallel to one another from the upper surface to the lower surface of light shielding wall 100. The light shielding wall 100 surrounds the side surfaces of the first, second, and third light emitting units 200, 300, and 400, each of which has a cuboid shape. Thus, the first vertical hole 101, the second vertical hole 102, and the third vertical hole 103 are substantially quadrangular in cross section. Tapered holes may also be used instead of the vertical holes.

The first light emitting unit 200 is arranged to fill the first vertical hole 101. The first light emitting unit 200 includes a first color filter 230 arranged in the upper portion of the inner space of the first vertical hole 101, a first LED chip 210 arranged at a vertical position below the first color filter 230, and a first wavelength converting element 220 interposed between the first color filter 230 and the first LED chip 210.

The second light emitting unit 300 is arranged to fill the second vertical hole 102. The second light emitting unit 300 includes a second color filter 330 arranged in the upper portion of the inner space of the second vertical hole 102, a second LED chip 310 arranged at a vertical position below the second color filter 330, and a second wavelength converting element 320 interposed between the second color filter 330 and the second LED chip 310.

The third light emitting unit 400 is arranged to fill the third vertical hole 103. The third light emitting unit 400 includes a third color filter 430 arranged in the upper portion of the inner space of the third vertical hole 103, a third LED chip 410 arranged at a vertical position below the third color filter 430, and a third wavelength converting element 420 interposed between the third color filter 430 and the third LED chip 410.

The first LED chip 210, the second LED chip 310, and the third LED chip 410 emit light of the same blue wavelength band. Each of the first wavelength converting element 220, the second wavelength converting element 320, and the third wavelength converting element 420 includes a yellow fluorescent material. The first wavelength converting element 220, the second wavelength converting element 320, and the third wavelength converting element 420 convert the wavelength of blue light from the first LED chip 210, the second LED chip 310, and the third LED chip 410, respectively, and mix the wavelength-converted light with non-converted light to produce white light.

The first color filter 230 filters out only light at a first wavelength, i.e. red light, from the white light obtained by the combination of the first LED chip 210 and the first wavelength converting element 220. The second color filter 330 filters out only light at a second wavelength, i.e. green light, from the white light obtained by the combination of the second LED chip 310 and the second wavelength converting element 320. The third color filter 430 filters out only light at a third wavelength, i.e. blue light, from the white light obtained by the combination of the third LED chip 410 and the third wavelength converting element 420. The first light emitting unit 200, the second light emitting unit 300, and the third light emitting unit 400 as unit chips of the LED pixel unit 1 constitute sub-pixels emitting red light, green light, and blue light, respectively, to form one pixel in an LED display panel.

According to the present embodiment, each of the first LED chip 210, the second LED chip 310, and the third LED chip 410 includes a light emitting surface and a pad forming surface. The light emitting surface is in contact with the wavelength converting element 220, 320 or 420 and the pad forming surface is exposed to the outside through the bottom of the vertical hole 101, 102 or 103 of the light shielding wall 100. As will be explained in detail below, the first LED chip 210, the second LED chip 310, and the third LED chip 410 include first conductive electrode pads E1 and second conductive electrode pads E2 on the pad forming surfaces located opposite to the light emitting surfaces in contact with the first, second, and third wavelength converting elements 220, 320, and 420, respectively. The first LED chip 210, the second LED chip 310, and the third LED chip 410 can be individually driven when power is supplied from the outside through the first conductive electrode pads E1, the second conductive electrode pads E2, and solder bumps (not illustrated) connected thereto. The first conductive electrode pads E1 and the second conductive electrode pads E2 protrude from the lower surface of the light shielding wall 100 so that they can be easily connected to bumps (not illustrated) connected to electrodes (not illustrated) on an external substrate (not illustrated).

The first LED chip 210, the second LED chip 310, and the third LED chip 410 include transparent semiconductor growth substrates 211, 311, and 411 and first conductive semiconductor layers 212, 312, and 412, active layers 213, 313, and 413, and second conductive semiconductor layers 214, 314, and 414 grown on the semiconductor growth substrates 211, 311, and 411, respectively. The transparent semiconductor growth substrates 211, 311, and 411 may be made of sapphire. The first conductive semiconductor layers 212, 312, and 412, the active layers 213, 313, and 413, and the second conductive semiconductor layers 214, 314, and 414 may be gallium nitride semiconductor layers grown on the sapphire substrates 211, 311, and 411, respectively. The first conductive semiconductor layers 212, 312, and 412 may be n-type semiconductor layers and the second conductive semiconductor layers 214, 314, and 414 may be p-type semiconductor layers. The active layers 213, 313, and 413 may include multi-quantum wells.

The first color filter 230, the second color filter 330, and the third color filter 430 are accommodated in the first vertical hole 101, the second vertical hole 102, and the third vertical hole 103 of the light shielding wall 100, respectively, and are in contact with the inner wall surfaces of the light shielding wall 100. Thus, the first color filter 230, the second color filter 330, and the third color filter 430 are isolated from one another. The first, second, and third wavelength converting elements 220, 320, and 420 and the transparent semiconductor growth substrates 211, 311, and 411 of the first, second, and third LED chips 210, 310, and 410 are accommodated in the first vertical hole 101, the second vertical hole 102, and the third vertical hole 103 of the light shielding wall 100, respectively, and are in contact with the inner wall surfaces of the light shielding wall 100. Thus, the first, second, and third wavelength converting elements 220, 320, and 420 are isolated from one another and the transparent semiconductor growth substrates 211, 311, and 411 are isolated from one another. Due to this construction, red light, green light, and blue light can be emitted from the first, second, and third light emitting units 200, 300, and 400 without being mixed in the light shielding wall 100, avoiding the need to employ complicated package structures or barriers. The light shielding wall 100 may be formed by a black color body, as explained below.

As mentioned above, it is preferred that at least portions of the side surfaces of the transparent semiconductor growth substrates 211, 311, and 411 are in contact with the inner side surfaces of the light shielding wall 100 and the side surfaces of some or all of the first conductive semiconductor layers 212, 312, and 412, the active layers 213, 313, and 413, and the second conductive semiconductor layers 214, 314, and 414 are exposed to the outside without contact with the light shielding wall 100. The exposure of at least portions of the first conductive semiconductor layers 212, 312, and 412, the active layers 213, 313, and 413, and the second conductive semiconductor layers 214, 314, and 414 from the light shielding wall 100 can minimize loss of light resulting from the absorption of light by the light shielding wall 100.

For uniform distribution of light, it is preferred that the upper surfaces of the first color filter 230, the second color filter 330, and the third color filter 430 lie at the same level as the upper surface of the light shielding wall. This can be achieved in an easy and simple manner by a method for fabricating LED pixel units, which will be explained in detail below. For uniform light distribution, it is also preferred that the first wavelength converting element 220, the second wavelength converting element 320, and the third wavelength converting element 420 lie at the same level. This can also be achieved in an easy and simple manner by the following method for fabricating LED pixel units.

As mentioned earlier, the first LED chip 210, the second LED chip 310, and the third LED chip 410 are preferably blue LED chips that emit blue light at a wavelength of 400 to 480 nm when power is applied thereto. Each of the first wavelength converting element 220, the second wavelength converting element 320, and the third wavelength converting element 420 is preferably a yellow fluorescent material. The first color filter 230, the second color filter 330, and the third color filter 430 are preferably a red filter, a green filter, and a blue filter that filter out red light, green light, and red light from white light, respectively. The LED chips 210, 310, and 410 of the first light emitting unit 200, the second light emitting unit 300, and the third light emitting unit 400 are the same LED chips grown on the same substrate by the same process. The wavelength converting elements 220, 320, and 420 are separated from one larger wavelength converting element. Therefore, the same white light is produced until the first, second, and third color filters 230, 330, and 430 are reached. The first, second, and third color filters 230, 330, and 430 can filter out light at particular wavelengths (i.e. red, green, and blue light) from the white light.

Figure 18:
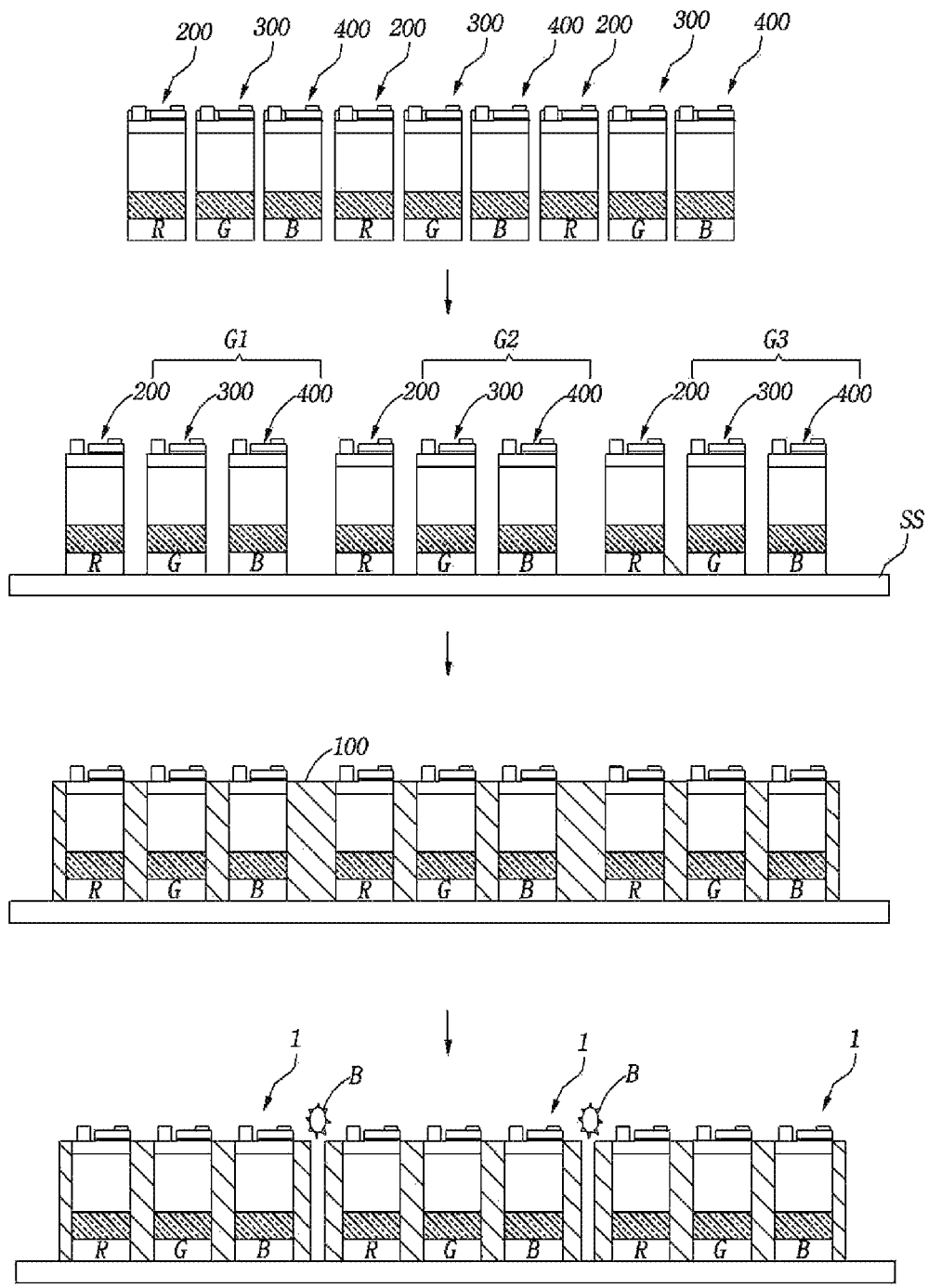
FIG. 18 illustrates a method for constructing LED pixel units according to one embodiment of the present disclosure.

The LED pixel unit 1, together with other LED pixel units constructed by the same process, is illustrated in FIG. 18. The LED pixel units are arranged in a matrix on a substrate, as illustrated in FIG. 18. Here, the first conductive electrode pads and the second conductive electrode pads disposed on the pad forming surfaces of the LED chips of the light emitting units of the LED pixel units are flip-chip bonded to electrodes disposed on the substrate for individual driving of the LED chips through solder bumps.

Referring now to FIGS. 18 to 22, an explanation will be given concerning a method for fabricating LED pixel units.

Figure 19:
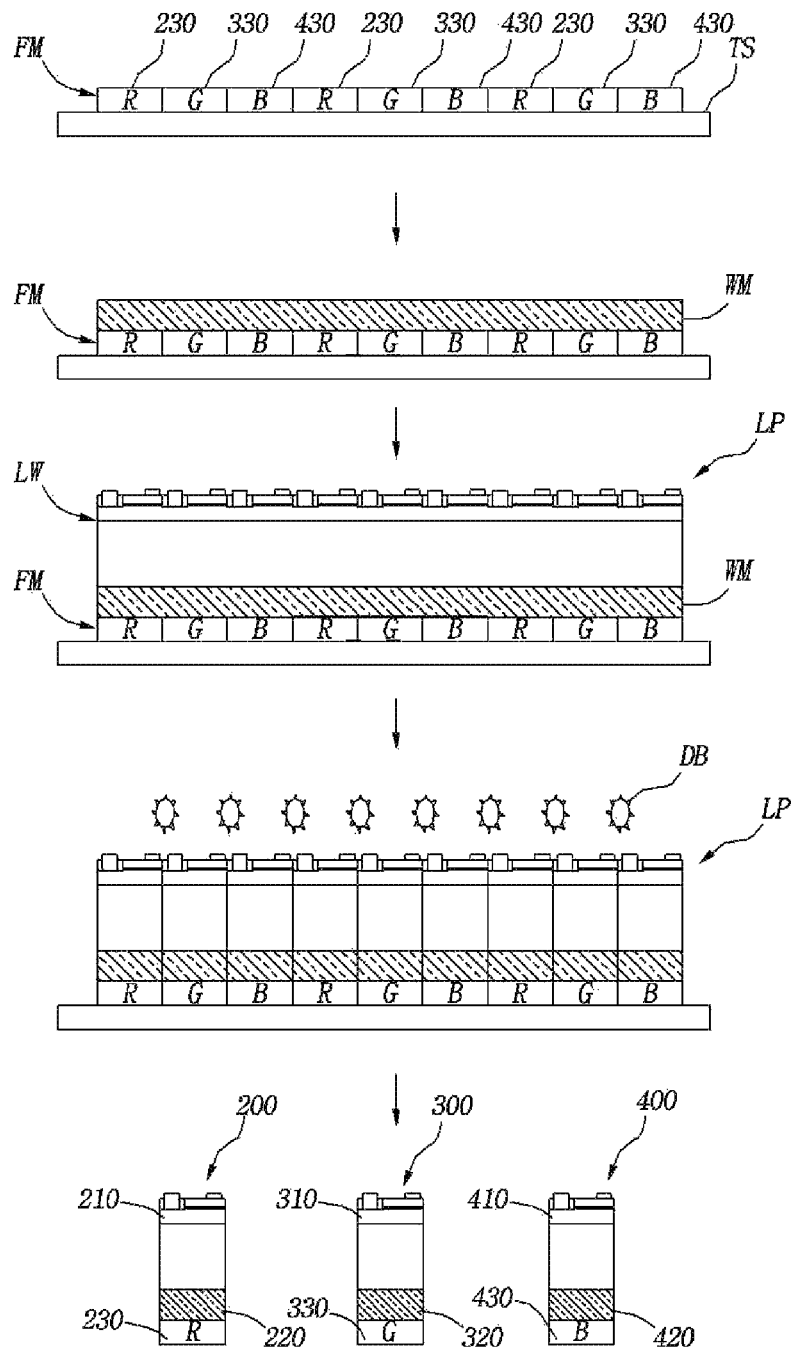
FIG. 19 specifically illustrates a procedure for the production of first, second, and third light emitting units in the method of FIG. 18.
Figure 20:
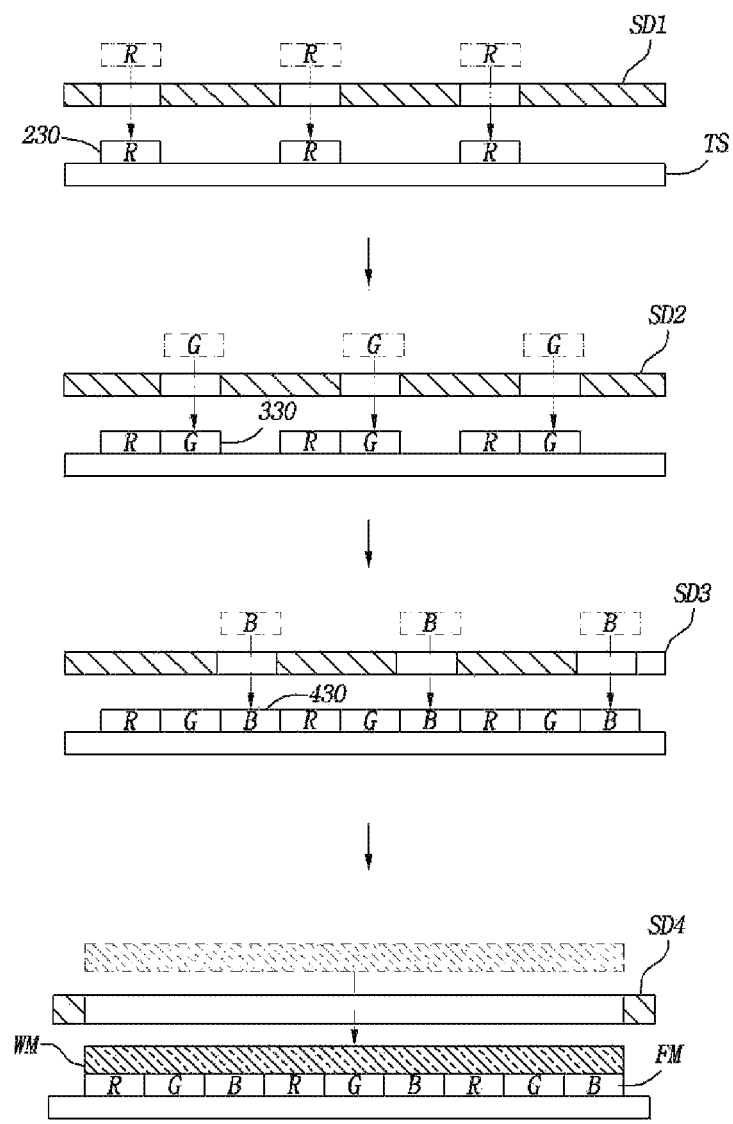
FIG. 20 illustrates a procedure for the formation of a color filter array film and a wavelength converting element during production of the first, second, and third light emitting units.
Figure 21:
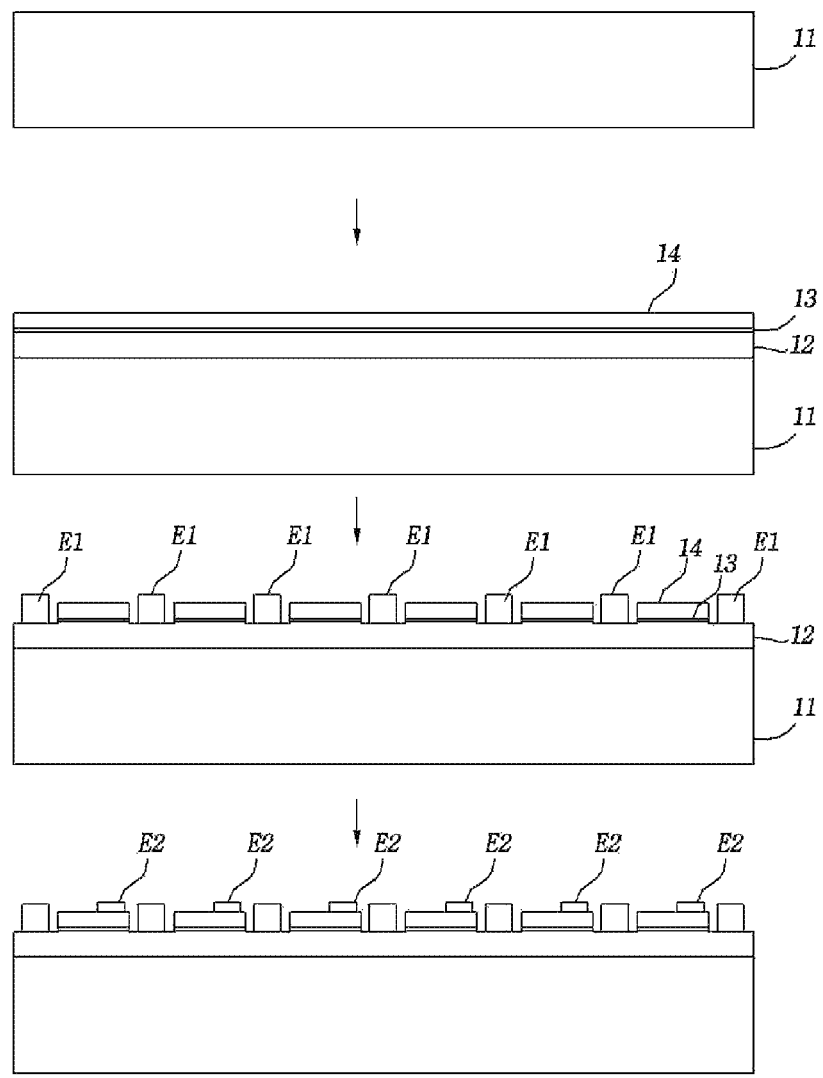
FIG. 21 illustrates a procedure for the production of an LED wafer during production of the first, second, and third light emitting units.
Figure 22:
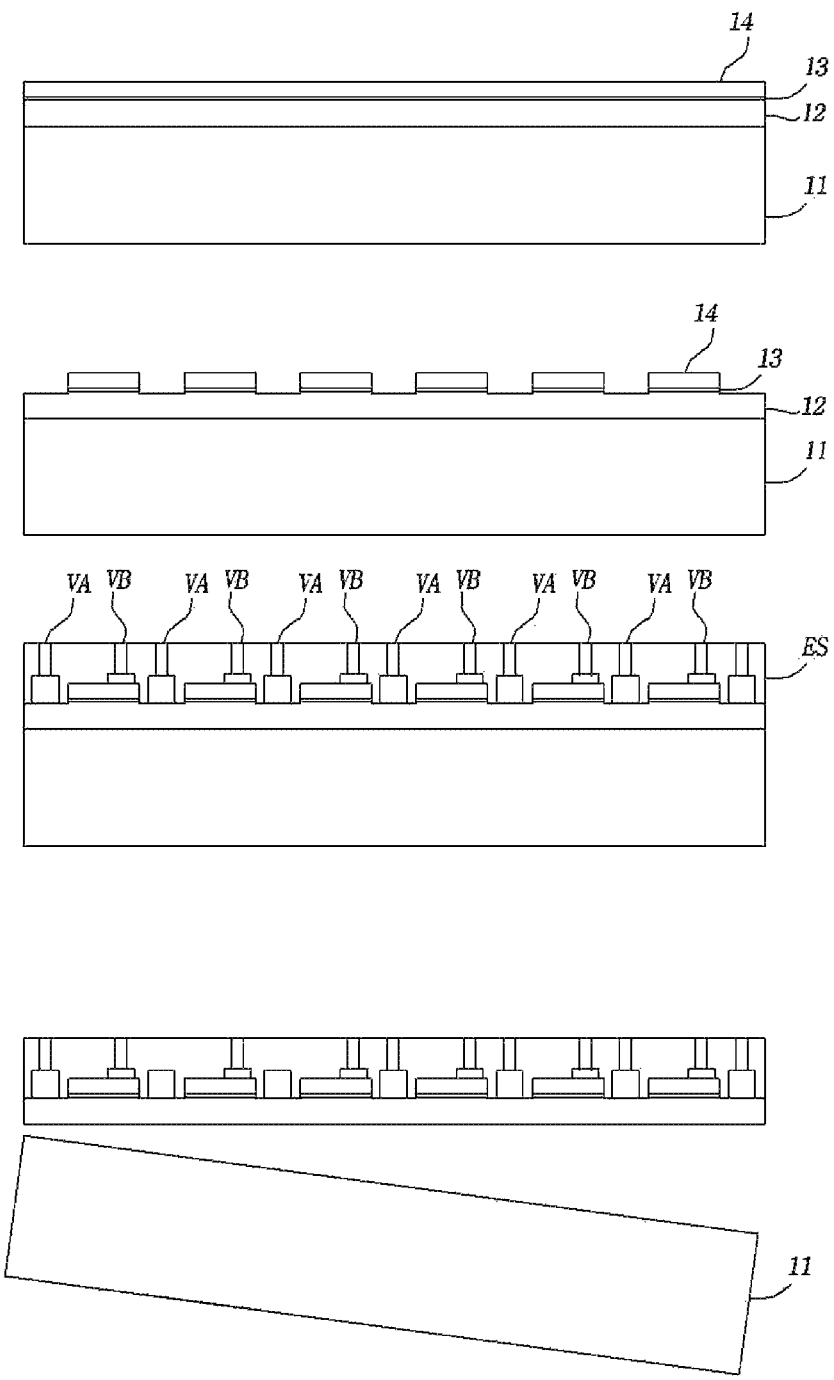
FIG. 22 illustrates a further procedure for the production of an LED wafer.

FIG. 18 illustrates a method for constructing LED pixel units according to the present invention, FIG. 19 specifically illustrates a procedure for the production of first, second, and third light emitting units in the method of FIG. 18, FIG. 20 illustrates a procedure for the formation of a laminate structure of a color filter array film and a wavelength converting element during production of the first, second, and third light emitting units, FIG. 21 illustrates a procedure for the production of an LED wafer during production of the first, second, and third light emitting units, and FIG. 22 illustrates a further procedure for the production of an LED wafer.

Referring first to FIG. 18, a method for constructing LED pixel units according to the present invention includes: producing first light emitting units 200, second light emitting units 300, and third light emitting units 400 (see FIG. 19); arraying the first light emitting units 200, the second light emitting units 300, and the third light emitting units 400 such that the first light emitting units 200, the second light emitting units 300, and the third light emitting units 400 are spaced apart from one another and a first group G1 including the first three consecutive light emitting units 200, 300, and 400, a second group G2 including the second three consecutive light emitting units 200, 300, and 400, and a third group G3 including the last three consecutive light emitting units 200, 300, and 400 are spaced apart from one another; forming a planar light shielding wall 100 to fill spaces between the first light emitting units 200, the second light emitting units 300, and the third light emitting units 400 and spaces between the first group G1, the second group G2, and the third group G3; and cutting the light shielding wall 100 such that the first group G1, the second group G2, and the third group G3 are separated from one another. The cutting of the light shielding wall 100 gives a plurality of LED pixel units 1 corresponding to the groups G1, G2, and G3.

The production of the first light emitting units 200, the second light emitting units 300, and the third light emitting units 400 will be explained in more detail with reference to FIG. 19. First, the first light emitting units 200, the second light emitting units 300, and the third light emitting units 400 are arrayed on the planar surface of an array support substrate SS such that the total heights of the first light emitting units 200, the second light emitting units 300, and the third light emitting units 400 are the same, the heights of the first, second, and third LED chips are the same, the heights of the first, second, and third wavelength converting elements are the same, and the heights of the first, second, and third color filters are the same.

Spaces between the first light emitting units 200, the second light emitting units 300, and the third light emitting units 400 arrayed on the support substrate SS and spaces between the groups G1, G2, and G3 including the first light emitting unit 200, the second light emitting unit 300, and the third light emitting unit 400 are filled with a black color body material. Then, the black color body material is coagulated to form the light shielding wall 100. The vertical holes formed in the light shielding wall 100 are substantially quadrangular in cross section and are upwardly and downwardly open because the light shielding wall 100 substantially surrounds the side surfaces of the light emitting units 200, 300, and 400, each of which has a substantially cuboid shape.

The light shielding wall 100 is cut in such a manner that the neighboring groups are separated from one another but the light emitting units in each group are not separated from one another. As a result, LED pixel units 1 can be obtained in which light interference between the first, second, and third light emitting units 200, 300, and 400 in each group G1, G2 or G3 is completely blocked by the light shielding wall 100. The light shielding wall 100 is preferably cut by sawing with a blade B.

Referring again to FIG. 16, the first light emitting unit 200, the second light emitting unit 300, and the third light emitting unit 400 of each LED pixel unit 1 include a first LED chip 210, a second LED chip 310, and a third LED chip 410, each of which includes an electrode pad forming surface and a light emitting surface opposite to the electrode pad forming surface, a first wavelength converting element 220, a second wavelength converting element 320, and a third wavelength converting element 420 formed on the light emitting surfaces of the first LED chip 210, the second LED chip 310, and the third LED chip 410, and a first color filter 230, a second color filter 330, and a third color filter 430 laminated on the first wavelength converting element 220, the second wavelength converting element 320, and the third wavelength converting element 420, respectively.

As explained before, the first LED chip 210, the second LED chip 310, and the third LED chip 410 emit blue light of the same wavelength, the first wavelength converting element 220, the second wavelength converting element 320, and the third wavelength converting element 420 convert the wavelength of the blue light and mix the wavelength-converted light with non-converted light to produce white light. The first color filter 230, the second color filter 330, and the third color filter 430 filter out light at different wavelengths from the white light.

Referring next to FIG. 19, the production of the first, second, and third light emitting units will be explained.

As well illustrated in FIG. 19, the production of the first, second, and third light emitting units includes: forming a color filter array film FM in which a first color filter 230, a second color filter 330, and a third color filter 430 are consecutively and repeatedly arranged two-dimensionally on a temporary substrate TS; forming a wavelength converting element WM over the color filter array film FM to form a laminate structure of the color filter array film FM and the wavelength converting element WM; producing an LED wafer LW including an electrode pad forming surface and a light emitting surface opposite to each other; stacking the laminate structure on the LED wafer LW such that the wavelength converting element WM is in contact with the light emitting surface, to construct a light emitting plate LP; and cutting the light emitting plate LP such that a first light emitting unit 200 including the first LED chip 210, the first wavelength converting element 220, and the first color filter 230, a second light emitting unit 300 including the second LED chip 310, the second wavelength converting element 320, and the second color filter 330, and a third light emitting unit 400 including the third LED chip 410, the third wavelength converting element 420, and the third color filter 430 are separated from one another. The light emitting plate LP is cut by dicing with a diamond blade DB.

The separation of the first LED chip 210, the second LED chip 310, and the third LED chip 410 from one larger LED wafer LW by cutting the light emitting plate LP explains the same luminescent properties (including the same wavelength) and the same height of the LED chips. The separation of the first color filter 230, the second color filter 330, and the third color filter 430 from one larger wavelength converting element WM by cutting the light emitting plate LP explains the same wavelength converting properties and the same height of the color filters. The first color filter 230, the second color filter 330, and the third color filter 430 have the same height that corresponds to the thickness of the color filter array film.

The first light emitting unit 200, the second light emitting unit 300, and the third light emitting unit 400 are used for the construction of LED pixel units, which have been explained with reference to FIG. 18.

The lamination of the color filter array film FM and the wavelength converting element WM in the production of the first, second, and third light emitting units will be explained in more detail with reference to FIG. 20.

Referring to FIG. 20, the formation of the color filter array film includes: forming first color filters 230 at desired positions on the temporary substrate TS through a 3D shadow mask SD1; forming second color filters 330 at positions on the temporary substrate TS through a 3D shadow mask SD2 other than the positions of the first color filters 230 such that the second color filters 330 are adjacent to the first color filters 230; and forming third color filters 430 at positions on the temporary substrate TS through a 3D shadow mask SD3 other than the positions of the first color filters 230 and the second color filters 330 such that the third color filters 430 are adjacent to the second color filters 330. The wavelength converting element WM is formed to a uniform thickness over the color filter array film FM including the first color filters 230, the second color filters 330, and the third color filters 430. A 3D shadow mask SD4 may be used to form the wavelength converting element WM. For example, a fluorescent material or quantum dots for wavelength conversion may be deposited to a uniform thickness on the color filter array film FM through a 3D shadow mask SD4 to form the wavelength converting element WM.

FIG. 21 illustrates a procedure for the production of the LED wafer during production of the first, second, and third light emitting units.

Referring to FIG. 21, the LED wafer is produced by the following procedure. First, a sapphire wafer 11 suitable for the growth of gallium nitride semiconductor layers is prepared. Next, a first conductive semiconductor layer 12, an active layer 13, and a second conductive semiconductor layer 14 are sequentially allowed to grow on the surface of the sapphire wafer 11. The first conductive semiconductor layer 12, the active layer 13, and the second conductive semiconductor layer 14 are gallium nitride semiconductor layers. Then, the second conductive semiconductor layer 14 and the active layer 13 are etched to predetermined depths such that areas of the first conductive semiconductor layer 12 are exposed. First conductive electrode pads E1 are disposed on the exposed areas of the first conductive semiconductor layer 12. Second conductive electrode pads E2 are formed on the second conductive semiconductor layer 14 so as to pair with the first conductive electrode pads E1. As a result of the etching, the exposed areas of the first conductive semiconductor layer 12 are stepped with the remaining areas of the second conductive semiconductor layer 14. One surface of the LED wafer on which the first and second conductive electrode pads E1 and E2 becomes an electrode pad forming surface and the opposite surface thereof (that is, the lower surface of the sapphire wafer 11) becomes a light emitting surface on which wavelength converting elements are to be laminated, which have been explained above.

Referring back to FIG. 19, the laminate structure of the wavelength converting element WM and the filter array film FM is stacked on the LED wafer LW such that the wavelength converting element WM is in direct contact with the lower surface of the sapphire wafer 11 of the LED wafer LW. As explained above, the light emitting plate constructed by stacking the laminate structure of the wavelength converting element WM and the color filter array film FM on the LED wafer LW is cut into the first light emitting units 200, the second light emitting units 300, and the second light emitting units 300. The first light emitting units 200, the second light emitting units 300, and the third light emitting units 400 include the first color filters 230, the second color filters 330, and the third color filters 430, respectively. Each of the first light emitting units 200, the second light emitting units 300, and the third light emitting units 400 includes the pair of electrode pads E1 and E2.

FIG. 22 illustrates a further procedure for the production of an LED wafer.

Referring to FIG. 22, a first conductive semiconductor layer 12, an active layer, and a second conductive semiconductor layer 14 as gallium nitride semiconductor layers are subsequently allowed to grow on the surface of a sapphire wafer 11, as in the previous procedure for the production of an LED wafer. The second conductive semiconductor layer 14 and the active layer 13 are etched to predetermined depths such that areas of the first conductive semiconductor layer 12 are exposed, which is also the same as in the previous procedure. Next, an electrode forming support substrate ES is formed on one surface of the LED wafer including the exposed areas of the first conductive semiconductor layer 12 and the exposed surfaces of the second conductive semiconductor layer 14. The electrode forming support substrate ES includes first conductive members VA connected to the exposed areas of the first conductive semiconductor layer 12 and second conductive members VB connected to the second conductive semiconductor layer 14. Next, the sapphire wafer 11 is peeled off. At this time, a laminate structure of a wavelength converting element WM and a color filter array film FM is stacked such that the wavelength converting element WM is in contact with the back surface of the first conductive semiconductor layer 11 from which the sapphire wafer 11 has been removed.

As noted herein, the present disclosure has been illustrated with specific examples described for the purpose of illustration only, and thus one skilled in the art may appreciate that other alternative and/or equivalent implementations may be substituted for the specific examples shown and described herein without departing from the scope of the present disclosure. As such, the present disclosure is intended to cover any adaptations or variations of the examples and/or equivalents shown and described herein, without departing from the spirit and the scope of the present disclosure.

What is claimed is:

1. An LED pixel unit comprising: a light shield wall having a first hole, a second hole, and a third hole extending from the upper surface to the lower surface thereof; a first light emitting unit arranged to fill the first hole; a second light emitting unit arranged to fill the second hole; and a third light emitting unit arranged to fill the third hole, wherein the first light emitting unit comprises a first color filter arranged in the upper portion of the inner space of the first hole, a first LED chip arranged below the first color filter, and a first wavelength converting element interposed between the first color filter and the first LED chip, the second light emitting unit comprises a second color filter arranged in the upper portion of the inner space of the second hole, a second LED chip arranged below the second color filter, and a second wavelength converting element interposed between the second color filter and the second LED chip, the third light emitting unit comprises a third color filter arranged in the upper portion of the inner space of the third hole, a third LED chip arranged below the third color filter, and a third wavelength converting element interposed between the third color filter and the third LED chip, the first LED chip, the second LED chip, and the third LED chip emit light of the same wavelength, the first wavelength converting element, the second wavelength converting element, and the third wavelength converting element receive and convert the light of the same wavelength emitted from the first LED chip, the second LED chip, and the third LED chip into white light, respectively, and the first color filter, the second color filter, and the third color filter separate light at a first wavelength, light at a second wavelength, and light at a third wavelength from the white light and allow the separated light to pass therethrough, respectively.

2. The LED pixel unit according to claim 1, wherein the first LED chip comprises a light emitting surface in contact with the first wavelength converting element and a pad forming surface located opposite to the light emitting surface and exposed to the outside, the second LED chip comprises a light emitting surface in contact with the second wavelength converting element and a pad forming surface located opposite to the light emitting surface and exposed to the outside, and the third LED chip comprises a light emitting surface in contact with the third wavelength converting element and a pad forming surface located opposite to the light emitting surface and exposed to the outside.

3. The LED pixel unit according to claim 2, wherein each of the first LED chip, the second LED chip, and the third LED chip comprises a first conductive electrode pad and a second conductive electrode pad disposed on the pad forming surface and protruding from the lower surface of the light shield wall to achieve flip-chip bonding.

4. The LED pixel unit according to claim 1, wherein the upper surfaces of the first color filter, the second color filter, and the third color filter lie at the same level as the upper surface of the light shield wall.

5. The LED pixel unit according to claim 1, wherein the first wavelength converting element, the second wavelength converting element, and the third wavelength converting element lie at the same level.

6. The LED pixel unit according to claim 1, wherein the first LED chip, the second LED chip, and the third LED chip are blue LED chips that emit blue light at a wavelength of 400 to 480 nm when power is applied thereto and each of the first wavelength converting element, the second wavelength converting element, and the third wavelength converting element is a yellow fluorescent material.

7. The LED pixel unit according to claim 1, wherein the first hole, the second hole, and the third hole are vertical or tapered holes.

8. The LED pixel unit according to claim 1, wherein the first color filter, the second color filter, and the third color filter are a red filter, a green filter, and a blue filter that separate red light, green light, and red light from white light and allow the separated light to pass therethrough, respectively.

9. The LED pixel unit according to claim 1, wherein each of the first wavelength converting element, the second wavelength converting element, and the third wavelength converting element is composed of a mixture of two or more fluorescent materials at least comprising a green fluorescent material and a red fluorescent material.

10. The LED pixel unit according to claim 3, wherein each of the first LED chip, the second LED chip, and the third LED chip comprises a first conductive semiconductor layer comprising the light emitting surface, a second conductive semiconductor layer comprising the pad forming surface, and an active layer formed between the first conductive semiconductor layer and the second conductive semiconductor layer.

11. The LED pixel unit according to claim 3, wherein each of the first LED chip, the second LED chip, and the third LED chip comprises a transparent semiconductor growth substrate comprising the light emitting surface and a first conductive semiconductor layer, an active layer, and a second conductive semiconductor layer grown on the transparent semiconductor growth substrate.

12. The LED pixel unit according to claim 11, wherein at least a portion of the side surface of the transparent semiconductor growth substrate is in contact with the corresponding inner side surface of the light shield wall and the side surface of at least one of the first conductive semiconductor layer, the active layer, and the second conductive semiconductor layer is exposed to the outside without contact with the light shield wall.

13. An LED pixel unit comprising a first light emitting unit, a second light emitting unit, a third light emitting unit, and a light shield wall filled between the first and second light emitting units and between the second and third light emitting units and surrounding the outer side surfaces of the first, second, and third light emitting units, wherein the first light emitting unit comprises a first LED chip comprising an electrode pad forming surface and a light emitting surface opposite to the electrode pad forming surface, a first wavelength converting element formed on the light emitting surface of the first LED chip, and a first color filter disposed on the first wavelength converting element, the second light emitting unit comprises a second LED chip comprising an electrode pad forming surface and a light emitting surface opposite to the electrode pad forming surface, a second wavelength converting element formed on the light emitting surface of the second LED chip, and a second color filter disposed on the second wavelength converting element, the third light emitting unit comprises a third LED chip comprising an electrode pad forming surface and a light emitting surface opposite to the electrode pad forming surface, a third wavelength converting element formed on the light emitting surface of the third LED chip, and a third color filter disposed on the third wavelength converting element, the first LED chip, the second LED chip, and the third LED chip emit light of the same wavelength, the first wavelength converting element, the second wavelength converting element, and the third wavelength converting element convert the light of the same wavelength into white light, and the first color filter, the second color filter, and the third color filter separate light at different wavelengths from the white light and allow the separated light to pass therethrough.

14. The LED pixel unit according to claim 13, wherein a first conductive electrode pad and a second conductive electrode pad are disposed on the pad forming surface and protrude from the lower surface of the light shield wall.

15. The LED pixel unit according to claim 13, wherein the upper surfaces of the first color filter, the second color filter, and the third color filter lie at the same level as the upper surface of the light shield wall.

16. The LED pixel unit according to claim 13, wherein the first wavelength converting element, the second wavelength converting element, and the third wavelength converting element lie at the same level.

* * * * *